(12) United States Patent
McGrath

(10) Patent No.: US 7,619,546 B2
(45) Date of Patent: Nov. 17, 2009

(54) ASYNCHRONOUS SAMPLE RATE CONVERSION USING A DIGITAL SIMULATION OF AN ANALOG FILTER

(75) Inventor: David Stanley McGrath, Sydney (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 12/087,938

(22) PCT Filed: Jan. 18, 2007

(86) PCT No.: PCT/US2007/001472

§ 371 (c)(1),
(2), (4) Date: Jul. 16, 2008

(87) PCT Pub. No.: WO2007/084687

PCT Pub. Date: Jul. 26, 2007

(65) Prior Publication Data

US 2009/0079599 A1    Mar. 26, 2009

Related U.S. Application Data

(60) Provisional application No. 60/759,897, filed on Jan. 18, 2006.

(51) Int. Cl.
*H03M 7/00* (2006.01)
(52) U.S. Cl. .......................................... 341/61; 341/50
(58) Field of Classification Search .............. 341/50–79
See application file for complete search history.

(56) References Cited

U.S. PATENT DOCUMENTS 6,665,694 B1 * 12/2003 Russell et al. ............... 708/313

* cited by examiner

*Primary Examiner*—Lam T Mai
(74) *Attorney, Agent, or Firm*—David N. Lathrop; Thomas A. Gallagher

(57) ABSTRACT

The sample rate of a digital signal is converted by a digital simulation of an analog filter. The simulation can update the states of complex poles in the analog filter at arbitrary times using different techniques. One technique updates the states at variable rates. Other techniques update the states at a fixed rate in response to values of input or output samples that are modified to account for offsets between the times of the samples and the times the states are updated. The states may be updated by using interpolations of complex exponential functions. Values of the complex exponential functions may be obtained from a product of values obtained from multiple lookup tables.

18 Claims, 8 Drawing Sheets

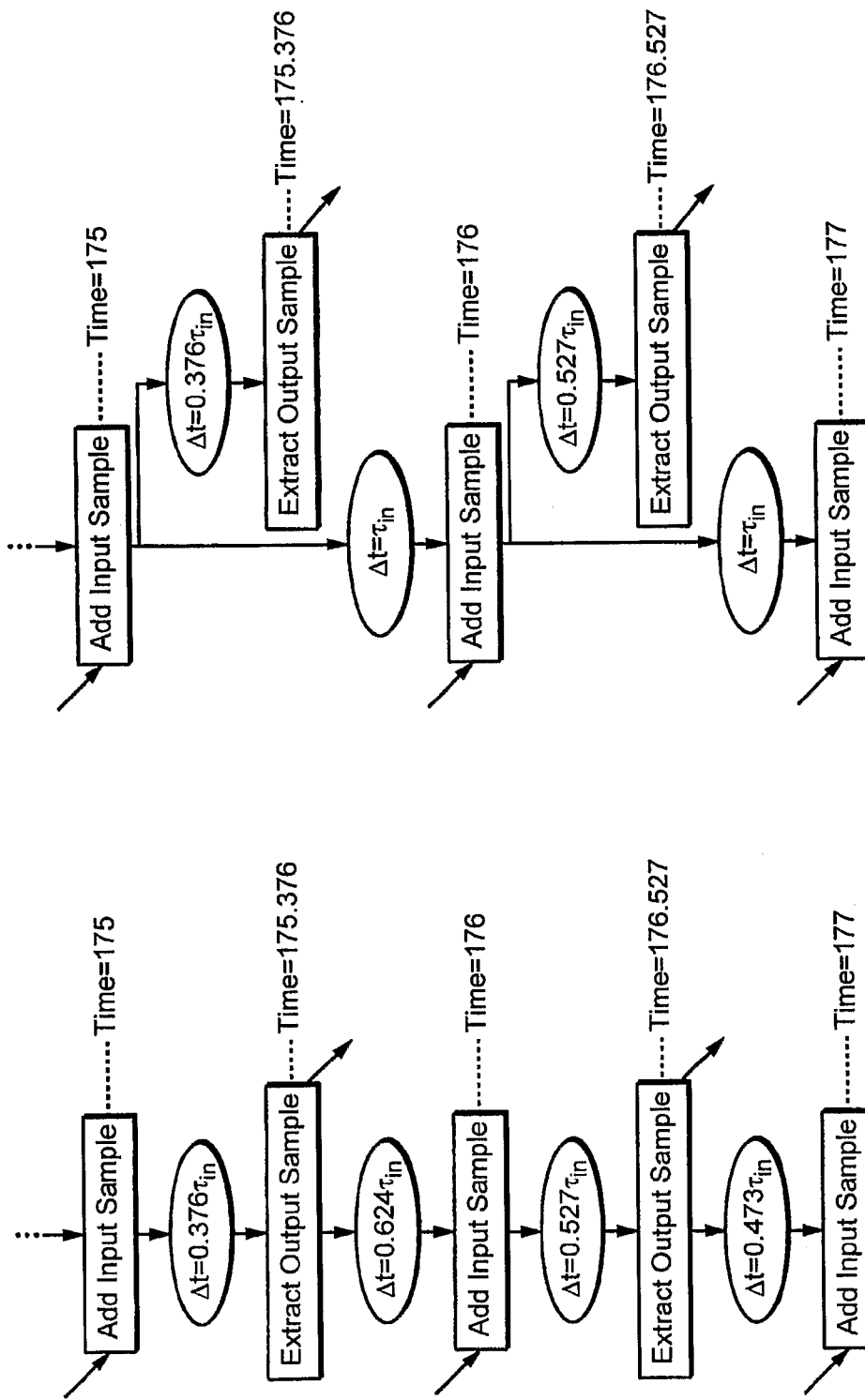

ASYNCHRONOUS SAMPLE RATE CONVERSION USING A DIGITAL SIMULATION OF AN ANALOG FILTER

TECHNICAL FIELD

The present invention pertains generally to processing digital signals and pertains more specifically to converting the sample rate of a digital signal.

BACKGROUND ART

An increasing number of devices including professional and consumer video and audio devices contain circuitry that processes digital signals. The signals that need to be passed between components of these types of systems are often digital rather than analog. Unfortunately, many of these components require signals that have different sample rates. Differences in sample rate can occur even between devices that use the same nominal rate if those devices operate with digital clocks or oscillators that differ in frequency. These differences may vary over time.

In situations where the output signal of one device is intended to be the input signal of another device, it is often necessary to convert the sample rate of the signal so that the two devices can work together. For ease of discussion in this disclosure, the signal whose sample rate must be converted is referred to as the "source signal" and its sample rate is referred to as the "source sample rate." The desired signal to be obtained by sample-rate conversion is referred to as the "destination signal" and its sample rate is referred to as the "destination sample rate."

Two ways that are known to convert the sample rate of a digital signal are known as "rational ratio sample-rate conversion" and "asynchronous sample-rate conversion."

Rational ratio sample-rate conversion can be used when the source sample rate and the destination sample rate are related to one another by a ratio that can be expressed as a constant rational factor. For example, the ratio of the sample rates for signals sampled at 48 kHz and 44.1 kHz can be expressed as the rational factor F=48000/44100=160/147.

Asynchronous sample-rate conversion is a more complex process that can be used when the ratio between the source sample rate and the destination sample rate is not constant. This conversion process must continually assess the ratio between source and destination rates and adapt the conversion process accordingly. This process can be used in situations where the sample rate of either or both signals varies over time.

The remainder of this disclosure is directed primarily to asynchronous sample-rate conversion techniques but principles of the present invention may also be applied to rational ratio sample-rate conversion techniques.

A variety of integrated circuits are available that can convert the sample rate of a digital signal. One example that is suitable for use with audio signals is the SRC4193 chip that is available from Texas Instruments Incorporated, Dallas, Tex. This device is typical of other devices that are available from other manufacturers. It can receive one or two digital signals having sample rates within a wide allowable range and convert the sample rate up or down to provide one or two digital signals having sample rates within a wide allowable range. It has features that are intended to facilitate its use in many practical situations including source and destination sample rates that may vary continuously and may be independent of the chip clock frequency.

The sample rate converter that is implemented in the SRC4193 chip as well as in other known chips use finite impulse response (FIR) filters. In essence, each destination signal sample is generated by applying a low-pass filter to the source signal samples. The cutoff frequency ($F_C$) of the low-pass filter is typically set equal to the lesser of one-half the source sample rate ($\frac{1}{2} F_{S,IN}$) and one-half the destination sample rate ($\frac{1}{2} F_{S,OUT}$). This can be expressed as:

$$F_C = \begin{cases} \dfrac{F_{S,IN}}{2} & \text{when } F_{S,IN} < F_{S,OUT} \\ \dfrac{F_{S,OUT}}{2} & \text{when } F_{S,IN} < F_{S,OUT} \end{cases}$$

This type of conversion is often difficult to implement because the cutoff frequency of the low-pass filter is linked to the source sample rate when the sample rate is converted upwards but is linked to the destination sample rate when the sample rate is converted downwards. One implementation uses two low-pass filters. One low-pass filter with a cutoff frequency $F_{C1}=\frac{1}{2} F_{S,IN}$ is used to interpolate source signal samples up to a higher intermediate sample rate. The other low-pass filter with a cutoff frequency $F_{C2}=\frac{1}{2} F_{S,OUT}$ is used to decimate the intermediate samples down to the destination sample-rate. In the SRC4193 chip, for example, the first low-pass filter interpolates up to a rate that is sixteen times the source sample rate and the second low-pass filter decimates down to the destination sample rate.

In addition to the difficulties explained above, the FIR implementation is not attractive in many applications because it requires a large amount of memory to store filter coefficients. In typical implementations, the FIR filters are used to compute destination signal samples that are delayed by fractions of a sample interval. The amount of the delay must be precise and stable to provide an accurate sample rate conversion and to avoid jitter-related noise in the destination signal. The necessary high time-resolution of the filter can be achieved if a set of filter coefficients for each possible delay is available. A large amount of memory is needed to store all of these coefficients. Alternatively, interpolation can be used with a smaller number of coefficient sets but much memory is still required because FIR filter coefficients generally cannot be determined accurately by interpolation between two sets of coefficients that represent widely-spaced events.

DISCLOSURE OF INVENTION

It is an object of the present invention to provide high-quality sample rate conversion that can adapt to changes in source and destination sample rates and that requires much less memory than conventional techniques.

According to the present invention, sample-rate conversion may be implemented using a discrete-time digital simulation of a continuous-time analog filter. This approach allows sample-rate conversion filters to be implemented with a very high time resolution without need for large amounts of memory to store tables of coefficients.

The various features of the present invention and its preferred embodiments may be better understood by referring to the following discussion and the accompanying drawings in which like references refer to like elements in the several figures. The contents of the following discussion and the drawings are set forth as examples only and should not be understood to represent limitations upon the scope of the present invention.

BRIEF DESCRIPTION OF DRAWINGS

FIGS. 7-11 are schematic diagrams of various operations that may be performed in digital simulations of analog filters to convert the sample rate of a source signal.

MODES FOR CARRYING OUT THE INVENTION

A. Introduction

Figure 1:
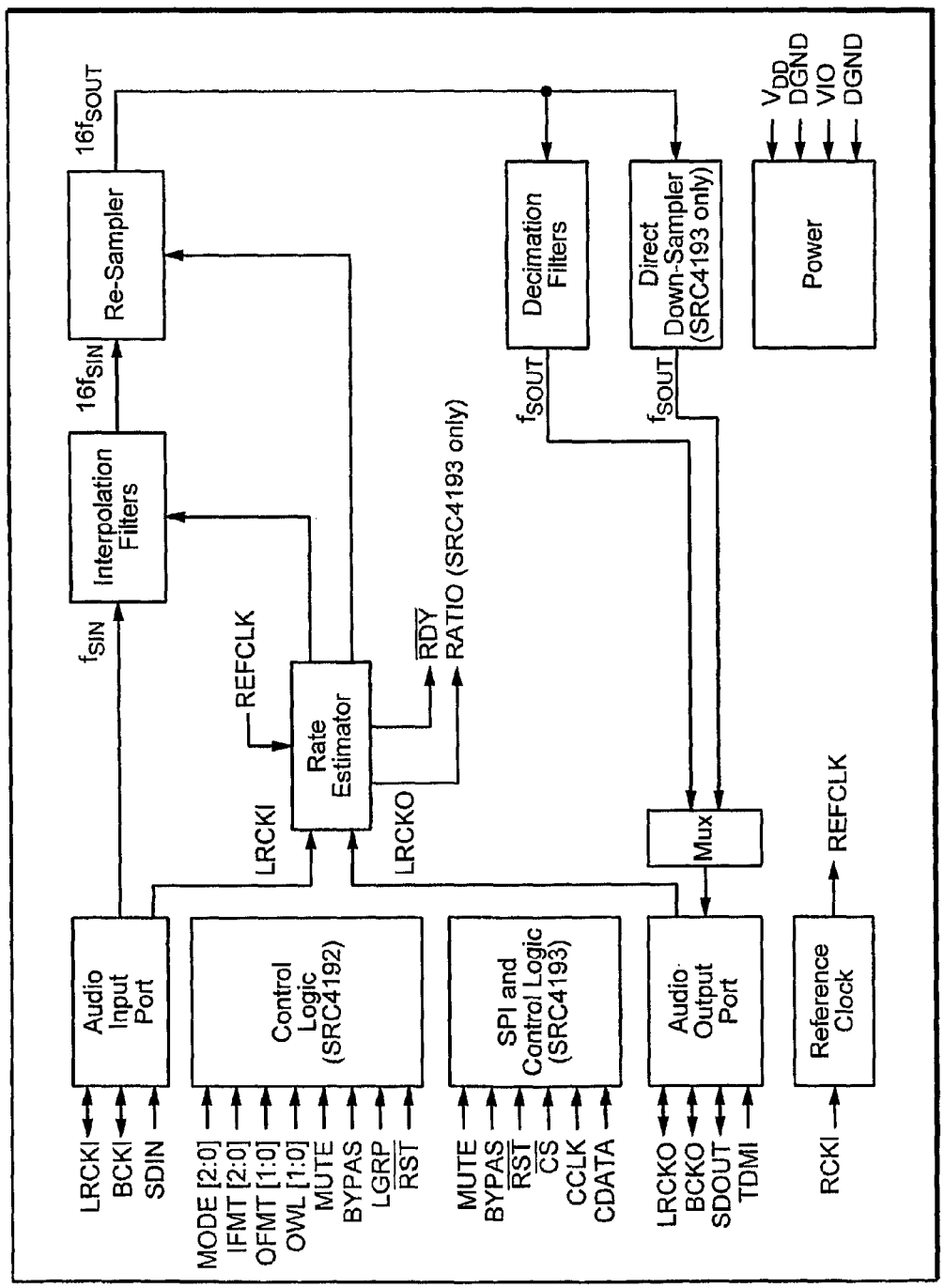
FIG. 1 is a schematic block diagram of an integrated circuit that implements a conventional sample-rate conversion technique.
Figure 2:
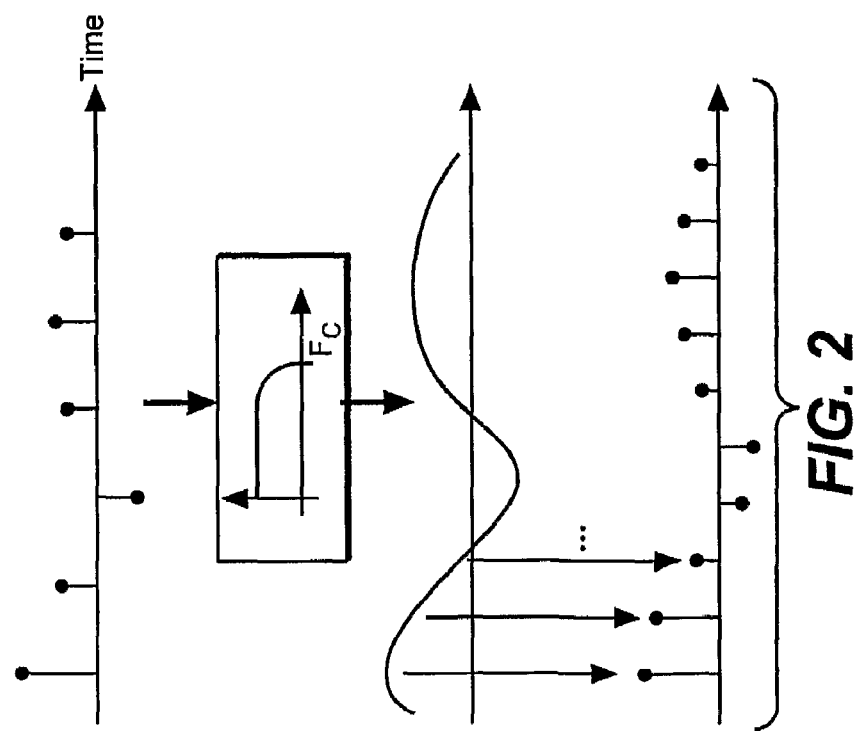
FIG. 2 is a schematic diagram of interpolation and decimation used in conventional sample-rate conversion techniques.

FIG. 1 is a schematic block diagram of the SRC4193 chip mentioned above that performs sample-rate conversion according to a conventional sample-rate conversion technique. This technique, which is illustrated schematically in FIG. 2, uses finite impulse response (FIR) filters to interpolate and decimate digital signals by various ratios to obtain the desired destination sample rate. The sample-rate converter shown in FIG. 1 uses one low-pass filter to interpolate the source signal samples up to an intermediate rate that is sixteen times higher than the source sample rate. Another low-pass filter decimates the intermediate samples down to the destination sample rate. Under certain conditions, the decimation filter can be bypassed and the intermediate samples downsampled directly to the desired destination sample rate.

Figure 3:
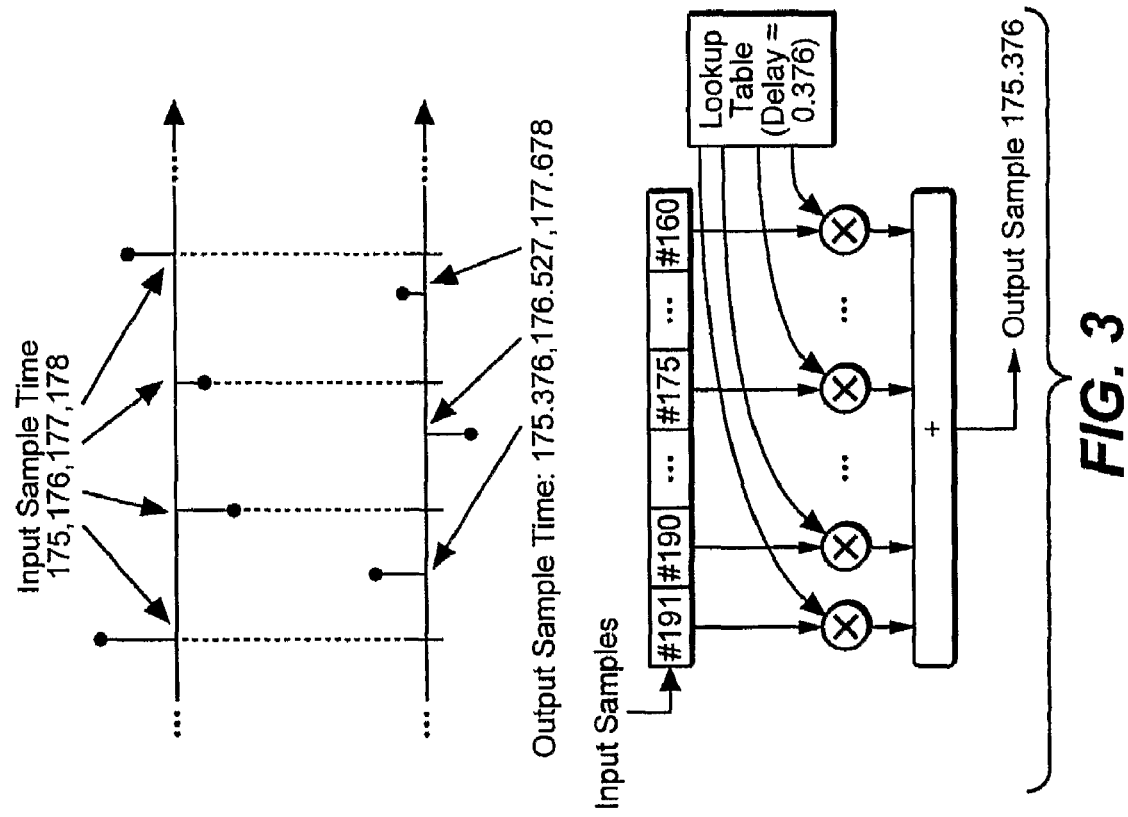
FIG. 3 is a schematic diagram of a conventional sample-rate conversion technique that uses a finite impulse response (FIR) filter.

Referring to the example shown in FIG. 3, a conventional sample-rate converter computes a destination signal sample for time t=175.376 by collecting thirty-two source signal samples in the tapped delay-line of an FIR filter and combining them using weighting coefficients selected from a lookup table. The coefficients are selected to implement a low-pass anti-aliasing filter as well as a delay that is equal to 0.376 of the source signal sample interval. In this example the delay, expressed as a fraction of the source signal sample interval, has a resolution of 0.001. The lookup table that is needed to implement this resolution requires 1000 entries with each entry containing thirty-two coefficients. If each coefficient is thirty-two bits in length, the memory needed to store these coefficients is 32×32,000 bits or 128 kBytes. If the time resolution is increased to 0.0001 of a sample interval, the coefficient lookup table is ten times larger.

It has been found that the time resolution should be accurate to about twenty-four bits if a sample-rate converter is required to give twenty-four bits of accuracy in the destination signal samples. For the example shown in FIG. 3, the lookup table would contain $2^{24}$ entries with each entry containing thirty-two coefficients. If each coefficient is thirty-two bits in length, this table would be at least 2 GBytes in size.

In practice, the coefficient tables are not this large. Various techniques such as interpolation are used to reduce the number of entries that must be stored; however, memory requirements are still impractical for many applications. In addition, these techniques require computational resources to calculate the desired coefficients and they can introduce errors into the coefficients.

The present invention works differently. A discrete-time digital system is used to simulate a continuous-time analog filter, which allows the time resolution of the filter to be set to essentially any desired amount. The system, which simulates the state of complex poles in the analog filter, can process source and destination signal samples at arbitrary times because the state of the filter can be advanced in arbitrarily small fractions of a sample interval. This process is illustrated schematically in FIG. 4.

A sample-rate converter that is implemented according to teachings of the present invention is capable of providing a variety of features that include the ability to convert between source and destination sample rates that can vary continuously and are independent of the converter clock frequency. These features are not discussed further because they are not needed to understand the present invention.

B. Digital Simulation of an Analog Filter

Figure 5:
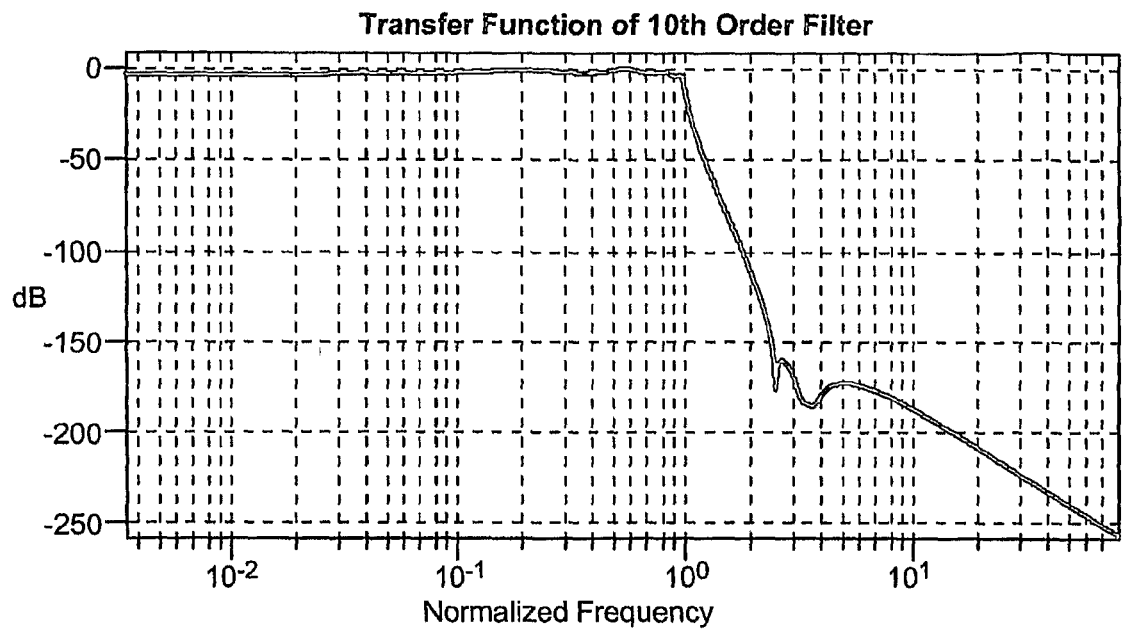
FIG. 5 is a graphical illustration of the transfer function of an analog filter that may be used for sample-rate conversion.

Preferably the analog filter has a low amount of ripple in its pass-band and a large amount of attenuation in its stop-band with a roll off in the stop-band at a rate of at least 12 dB per octave so that the filter gain is zero at s=∞. The transfer function of a suitable filter is shown in FIG. 5. This filter comprises an eighth-order order elliptical low-pass filter in cascade with a second-order Butterworth low-pass filter. The elliptical filter provides the steep transition between the pass-band and the stop-band and the Butterworth filter provides the 12 dB per octave roll-off in the stop-band. This roll-off ensures the total energy passed by the filter in the stop-band is bounded to an acceptable level and helps reduce the energy that can potentially be folded down into the pass-band when aliasing occurs.

This composite tenth-order filter has five pairs of conjugate poles. Its transfer function can be expressed in the s domain as:

$$H(s) = \frac{\begin{array}{c}b_{10}s^{10} + b_9s^9 + b_8s^8 + b_7s^7 + b_6s^6 + \\ b_5s^5 + b_4s^4 + b_3s^3 + b_2s^2 + b_1s^1 + b_0\end{array}}{\begin{array}{c}a_{10}s^{10} + a_9s^9 + a_8s^8 + a_7s^7 + a_6s^6 + \\ a_5s^5 + a_4s^4 + a_3s^3 + a_2s^2 + a_1s^1 + a_0\end{array}} \quad (1)$$

$$= \frac{\begin{array}{c}b_{10}s^{10} + b_9s^9 + b_8s^8 + b_7s^7 + b_6s^6 + \\ b_5s^5 + b_4s^4 + b_3s^3 + b_2s^2 + b_1s^1 + b_0\end{array}}{\begin{array}{c}(s - P_1)(s - P_1^*)(s - P_2)(s - P_2^*)(s - P_3) \\ (s - P_3^*)(s - P_4)(s - P_4^*)(s - P_5)(s - P_5^*)\end{array}}$$

$$= K + \frac{R_1}{(s - P_1)} + \frac{R_1^*}{(s - P_1^*)} + \frac{R_2}{(s - P_2)} + \frac{R_2^*}{(s - P_2^*)}$$

$$\frac{R_3}{(s - P_3)} + \frac{R_3^*}{(s - P_3^*)} + \frac{R_4}{(s - P_4)} + \frac{R_4^*}{(s - P_4^*)} +$$

$$\frac{R_5}{(s - P_5)} + \frac{R_5^*}{(s - P_5^*)}$$

Because the gain of this filter is zero at $s=\infty$, the coefficient $K=0$, which simplifies the transfer function as follows:

$$H(s) = \frac{R_1}{(s-P_1)} + \frac{R_1^*}{(s-P_1^*)} + \frac{R_2}{(s-P_2)} + \frac{R_2^*}{(s-P_2^*)} + \frac{R_3}{(s-P_3)} + \frac{R_3^*}{(s-P_3^*)} + \frac{R_4}{(s-P_4)} + \frac{R_4^*}{(s-P_4^*)} + \frac{R_5}{(s-P_5)} + \frac{R_5^*}{(s-P_5^*)} \quad (2)$$

This transfer function may be implemented by a digital simulation using a sampling interval $\tau_s$ that ensures the sampling frequency $F_s$ is much larger than the frequency of the largest pole $P_i$. For example, the sampling interval may be set to a very small value such as one nanosecond. This is an extremely high sample rate as compared to the rates encountered in typical audio applications, for example, but it is only of mathematical significance. Because the sampling frequency is very high, the approximation $s=\log(z)/\tau_s$ is reasonably accurate and the z-domain poles $p_1, \ldots p_5$ can be mapped to the s-domain poles $P_1, \ldots P_5$ by the expression $P_i = \log(p_i)/\tau_s$. Furthermore, for values of $z$ and $p_i$ very close to unity, the approximation $\log(z) \approx z-1$ also holds.

Using these approximations and mappings, the term $(s-P_i)$ can be rewritten as $(\log(z)/\tau_s - \log(p_i)/\tau_s)$, which can be approximated by $((z-1)/\tau_s - (p_i-1)/\tau_s)$, and this can be simplified to be $(z-p_i)/\tau_s$. This allows the transfer function to be expressed as:

$$H(z) = \frac{R_1}{(s-P_1)} + \frac{R_1^*}{(s-P_1^*)} + \frac{R_2}{(s-P_2)} + \frac{R_2^*}{(s-P_2^*)} + \frac{R_3}{(s-P_3)} + \frac{R_3^*}{(s-P_3^*)} + \frac{R_4}{(s-P_4)} + \frac{R_4^*}{(s-P_4^*)} + \frac{R_5}{(s-P_5)} + \frac{R_5^*}{(s-P_5^*)} \quad (3)$$

$$= \frac{R_1}{\left(\frac{z-p_1}{\tau_s}\right)} + \frac{R_1^*}{\left(\frac{z-p_1^*}{\tau_s}\right)} + \frac{R_2}{\left(\frac{z-p_2}{\tau_s}\right)} + \frac{R_2^*}{\left(\frac{z-p_2^*}{\tau_s}\right)} + \frac{R_3}{\left(\frac{z-p_3}{\tau_s}\right)} + \frac{R_3^*}{\left(\frac{z-p_3^*}{\tau_s}\right)} + \frac{R_4}{\left(\frac{z-p_4}{\tau_s}\right)} + \frac{R_4^*}{\left(\frac{z-p_4^*}{\tau_s}\right)} + \frac{R_5}{\left(\frac{z-p_5}{\tau_s}\right)} + \frac{R_5^*}{\left(\frac{z-p_5^*}{\tau_s}\right)}$$

which can be rewritten as:

$$H(z) = \tau_s \left( \frac{R_1}{(z-p_1)} + \frac{R_1^*}{(z-p_1^*)} + \frac{R_2}{(z-p_2)} + \frac{R_2^*}{(z-p_2^*)} + \frac{R_3}{(z-p_3)} + \frac{R_3^*}{(z-p_3^*)} + \frac{R_4}{(z-p_4)} + \frac{R_4^*}{(z-p_4^*)} + \frac{R_5}{(z-p_5)} + \frac{R_5^*}{(z-p_5^*)} \right) \quad (4)$$

Figure 6:
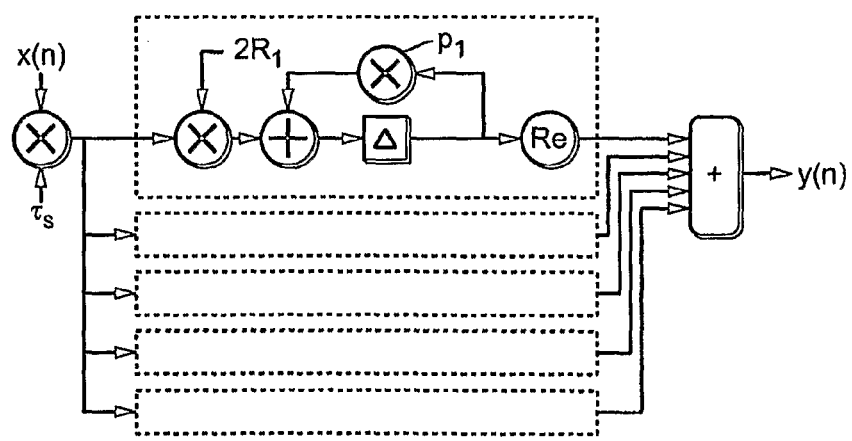
FIG. 6 is a schematic block diagram of a sample-rate converter with several second-order filters arranged in parallel.

This filter can be implemented by a discrete-time digital system such as the one shown in FIG. 6 that has five second-order filter sections arranged in parallel with one another. The input and output of each filter section are real-valued signal samples but the internal signals of each filter section comprise complex-valued samples. The coefficients $R_j$ and the pole locations $p_j$ are represented by complex values. The component with the "Re" label extracts the real part of the complex signal sample that appears after the delay element and passes this real part to the output of the filter section.

Each filter section can also be represented by two difference equations. The first difference equation represents the input/state portion of filter section operation that receives source signal samples and updates state variables. The second difference equation represents the output portion of filter section operation that computes destination signal samples. The first difference equations for all sections in the filter can be written as the matrix and vector operations shown in expression 5 and the second difference equations for all sections can be written as shown in expression 6:

$$\begin{pmatrix} State_1(n+1) \\ State_2(n+1) \\ State_3(n+1) \\ State_4(n+1) \\ State_5(n+1) \end{pmatrix} = \begin{pmatrix} p_1 & 0 & 0 & 0 & 0 \\ 0 & p_2 & 0 & 0 & 0 \\ 0 & 0 & p_3 & 0 & 0 \\ 0 & 0 & 0 & p_4 & 0 \\ 0 & 0 & 0 & 0 & p_5 \end{pmatrix} \begin{pmatrix} State_1(n) \\ State_2(n) \\ State_3(n) \\ State_4(n) \\ State_5(n) \end{pmatrix} + \begin{pmatrix} R_2 \\ R_2 \\ R_3 \\ R_4 \\ R_5 \end{pmatrix} 2x(n)\tau_s \quad (5)$$

$$y(n) = \sum_{i=1}^{5} \text{Re}(State_i(n)) \quad (6)$$

Expression 5 can be rewritten in a more compact notation shown in expression 7:

$$\text{State}(n+1) = P \times \text{State}(n) + 2 \times R \times x(n) \times \tau_s \quad (7)$$

In principle, each section of the filter shown in FIG. 6 processes samples at a very high rate specified by the sampling interval $\tau_s$. If source signal samples arrive at a lower rate, this can be simulated by inserting zeros into the sample intervals that do not have a source signal sample and by increasing the weighting of each source signal sample. For example, if a source signal sample arrives only once per ten sampling intervals, these samples are multiplied by a factor of ten and nine zeroes are inserted between each adjacent pair of source signal samples. This modification can be expressed as changing the factor $R \times x(n) \times 2\tau_s$ to $R \times x(n) \times 2\tau_{in}$, where $\tau_{in}$ is the interval between adjacent source signal samples.

A simulation of filter operation for arbitrary arrival times of source signal samples and arbitrary output times of destination signal samples can be obtained by rewriting the input process as shown in expression 8, the state-update process as shown in expression 9 and the output process as shown in expression 10:

$$\text{State}(t) \Leftarrow \text{State}(t) + R \times x(t) \times 2\tau_{in} \quad (8)$$

$$\text{State}(t+\Delta t) \Leftarrow P^{\Delta t/\tau_s} \times \text{State}(t) \quad (9)$$

$$y(t) \Leftarrow \sum_{i=1}^{5} \text{Re}(State_i(t)) \quad (10)$$

where $\Delta t$=the interval of time between two consecutive events (input sample arrival or output sample generation events). These expressions allow both $t$ and $\Delta t$ to have arbitrary real values that are independent of the sampling interval $\tau_s$.

A simulation of this analog filter for a source signal with a sample interval $\tau_{in}$ can be implemented by the following process in which operations 2, 3 and 4 are performed after initialization and independently of one another as needed:

1. Initialize the state of the filter in five complex state variables $S_1, \ldots S_5$.
2. Receive each source signal sample $x_n$ and add its value to the state variables as follows: $S_i = S_i + 2R_i x_n \tau_{in}$.

3. Compute each destination signal sample $y_k$ as follows:

$$y_k = \sum_{i=1}^{5} \text{Re}(S_i)$$

4. Update the state variables as follows: $S_i = S_i P^{\Delta t/\tau_s}$

Figure 7:
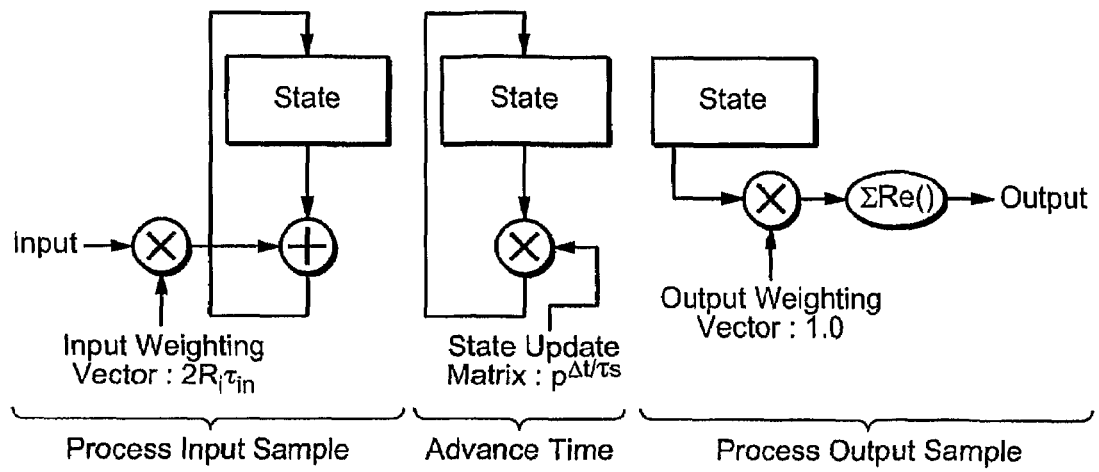

The three basic parts of this process as shown in expressions 8 through 10 are illustrated schematically in FIG. 7.

Figure 4:
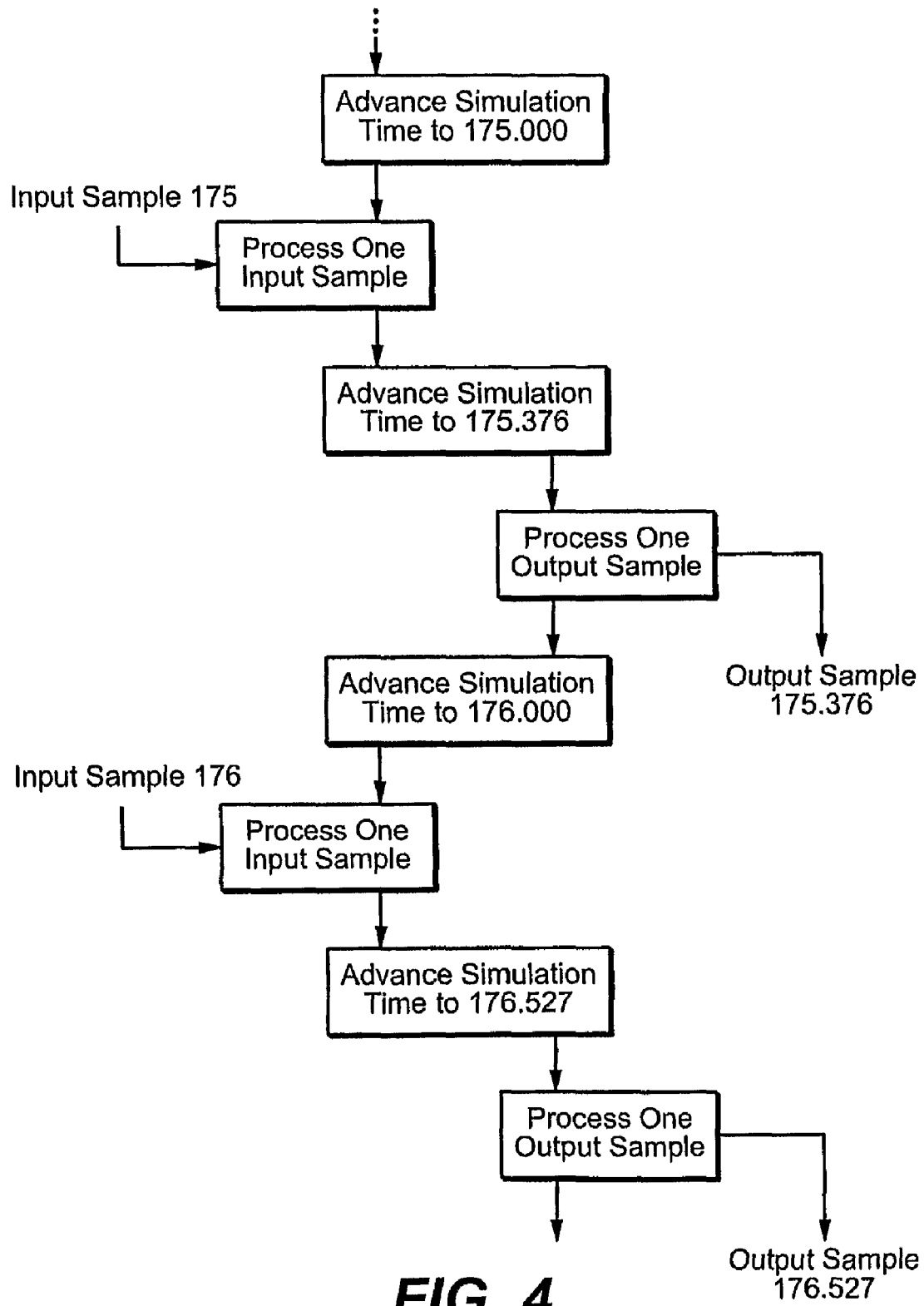
FIG. 4 is a schematic diagram of a sample-rate conversion technique that uses a discrete-time digital simulation of a continuous-time analog filter.
Figure 8:
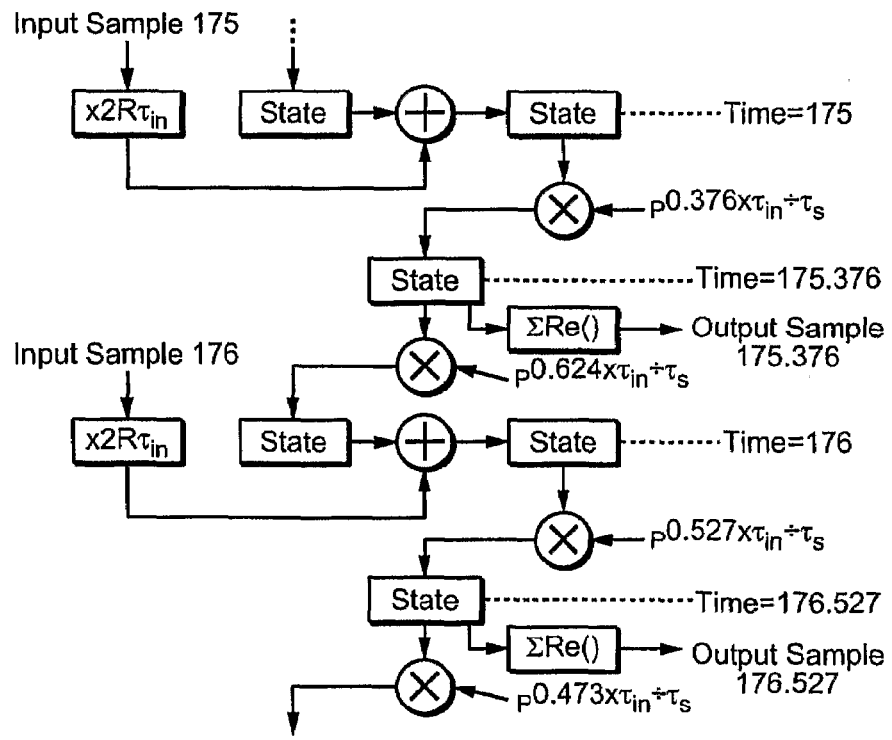

The steps of this process that perform the example shown in FIG. 4 are illustrated in FIG. 8. Referring to FIG. 8, the time scale shown on the right-hand side is expressed in terms of source signal sample intervals, which is an arbitrary choice of time scale. Between the time instances 175.000 and 175.376 the state of the filter is advanced by multiplying each state variable in a particular filter section by its corresponding pole, taking into account the precise size of the time interval $\Delta t = 0.376 \, \tau_{in}$.

In this example, the time interval between adjacent source signal samples is equal to $\tau_{in}$. The time interval between adjacent destination signal samples is equal to $\tau_{out}$, where $\tau_{out} = 1.151 \tau_{in}$. The two destination signal samples shown in FIG. 8 are output at times $175.376 \tau_{in}$ and $176.527 \tau_{in}$ so that the time interval between the adjacent destination signal samples is equal to $1.151 \tau_{in}$.

C. Look-Up Tables

The need to operate the filter with a high time resolution requires the ability to compute the state-update factors $P^{\Delta t}$ with high accuracy. A simple implementation that stores all of the needed values in a look-up table would require an extensive amount of memory. The amount of memory can be reduced significantly by a slightly more complex process that takes advantage of the following identity:

$$P^{a+b} = P^a \times P^b \quad (11)$$

This identity allows a high-resolution system to be implemented using a few small tables. For example, the value for $P^{0.527}$ can be computed by the following:

$$P^{0.527} = P^{0.5} \times P^{0.02} \times P^{0.007}$$

The first two terms in this expression can be stored in look-up tables. One look-up can store values for a coarse resolution such as 0.1. This table would store the values for $P^{0.0}$, $P^{0.1}$, $P^{0.2}$, ... $P^{0.9}$. Another look-up table can store values for a finer resolution such as 0.01. This table would store the values for $P^{0.00}$, $P^{0.01}$, $P^{0.02}$, ... $P^{0.09}$.

The finest resolution could be stored in a third table in the same manner or it can be computed using the following approximation:

$$P^{a\Delta n} \cong 1 + a(P^{\Delta n} + 1) \quad (12)$$

By setting $\Delta n = 0.001$, the constant $P_i^{0.001}$ can be computed for each pole $P_i$ of the filter and stored for later use. The value needed for the resolution 0.001 can be obtained from expression 12 using the values a=0, 1, 2, ... 9. If desired, a can be allowed to take on a fractional value such as 3.1459 to obtain essentially any desired time resolution.

The examples discussed here are expressed with decimal numbers to aid in understanding. These principles can be extended to other base-number systems such as base-2 or binary systems used by many digital computers. Empirical tests with audio applications suggest the look-up table should have a time-resolution of about 512 steps per audio signal sample interval. This resolution can be achieved in a number of ways including one single look-up table with 512 entries, two look-up tables with thirty-two and sixteen entries (because 32×16=512), or some other combination of tables having a number of entries whose product equals or exceeds 512.

In a preferred implementation, the time for each signal sample is determined with a resolution of twenty-four bits, which is sufficient to allow filter processing to have a signal-to-noise ratio better than 120 dB. The nine most significant bits of the time measurement can be processed using one or more look-up tables to compute a partial product $P^{\Delta t}$ and the factor representing the remaining fifteen bits can be obtained by interpolation as explained above.

D. Alternative Implementations

Figure 11:
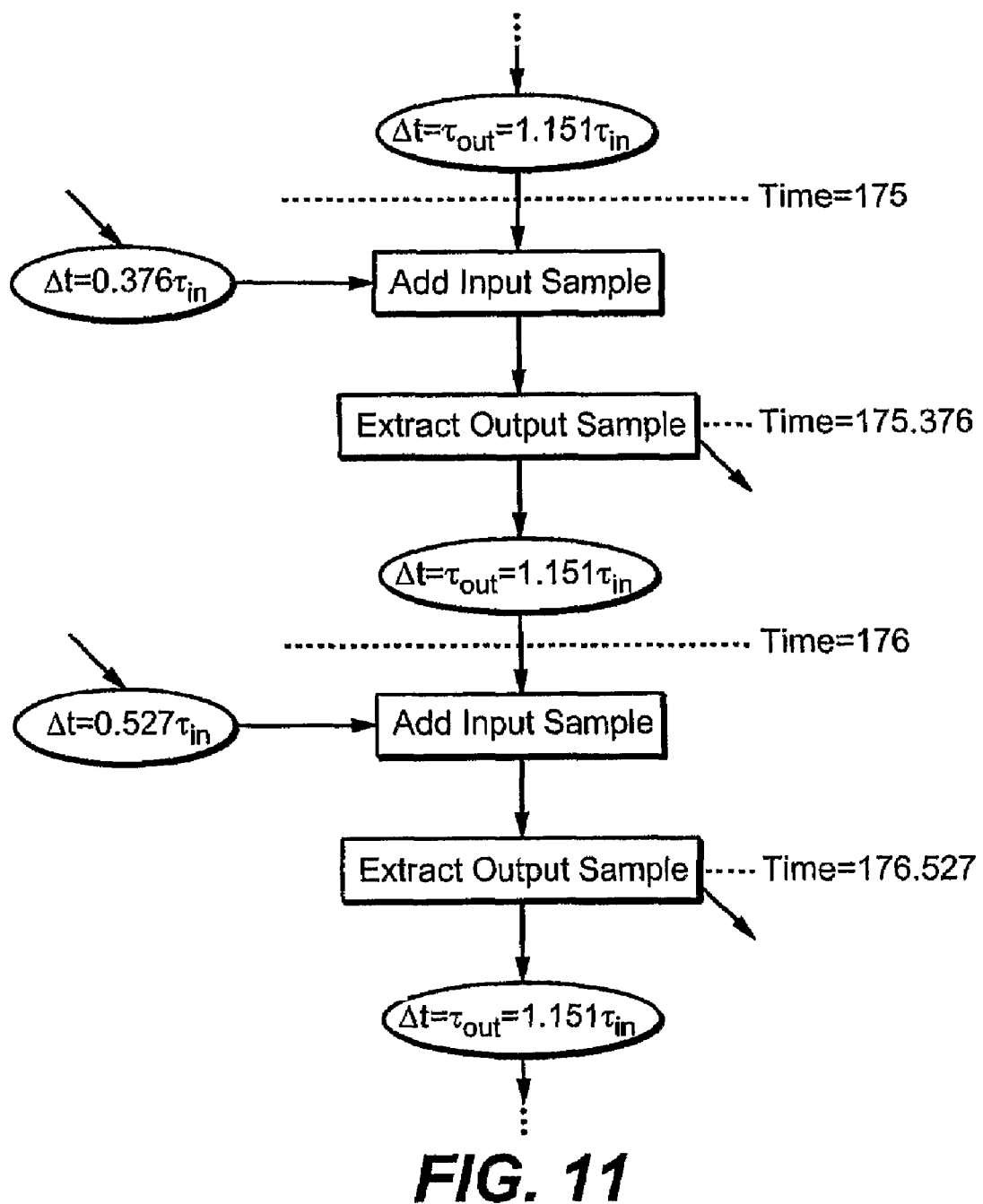

FIGS. 9, 10 and 11 show three alternative implementations of the analog filter. FIG. 9 illustrates the implementation shown in FIG. 8 in a different form to facilitate a comparison with the alternative implementations shown in the other figures.

As explained above, the implementation shown in FIG. 9 updates the filter state variable between source and destination samples. The implementation shown in FIG. 10 updates filter state variable between adjacent source signal samples. The implementation shown in FIG. 11 updates filter state variable between adjacent destination signal samples.

E. Correcting for Pass-Band Ripple

A sample-rate converter that is implemented according to the present invention can improve the fidelity of the destination signal by including an additional correction filter to improve the overall transfer function so that it has a flatter frequency response and reduced phase shift in the pass-band. Empirical tests have shown that a sixty-four tap FIR filter can be used to reduce pass-band ripple to less than 0.1 dB.

F. Exemplary Implementation

Figure 12:
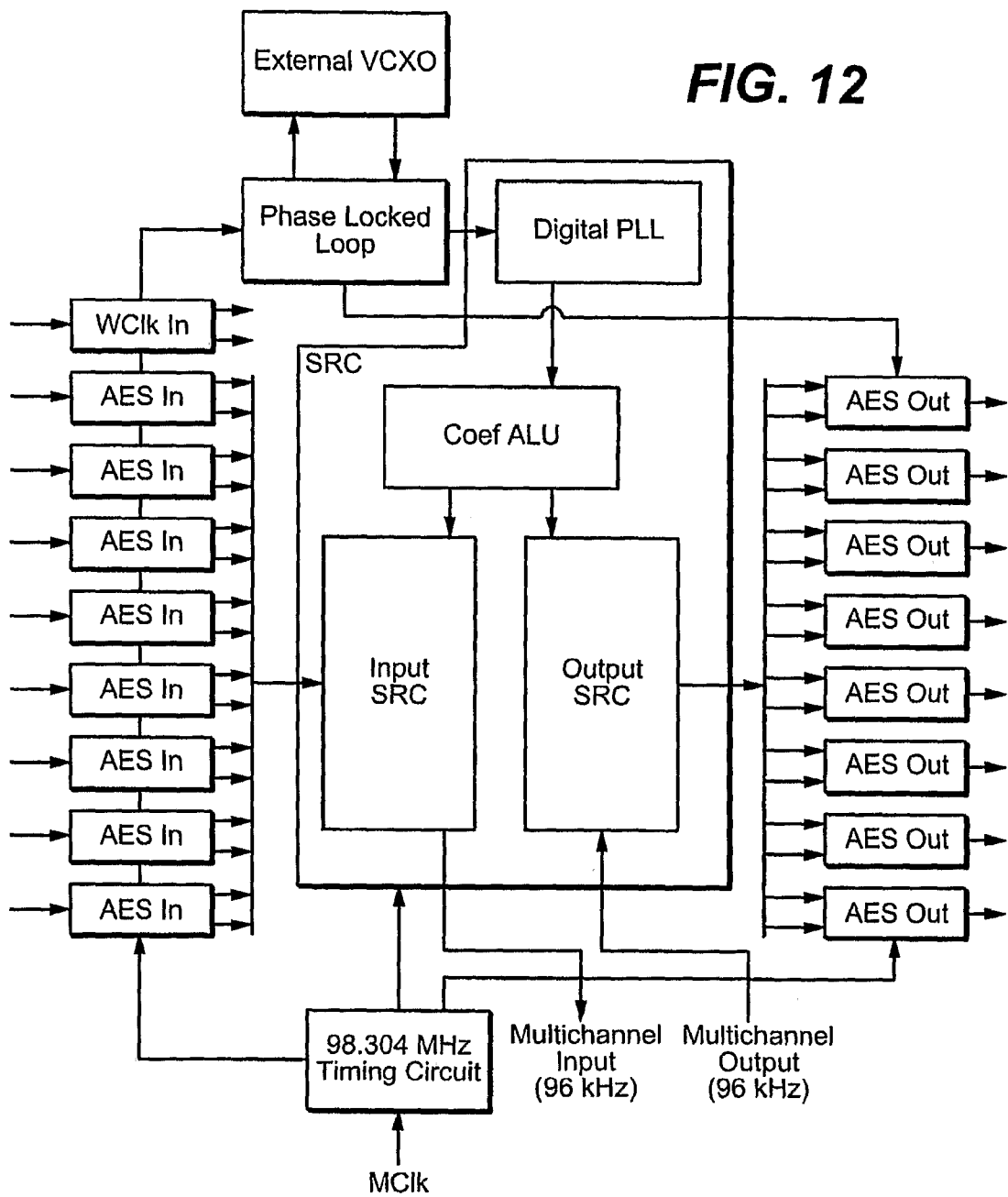
FIG. 12 is a schematic block diagram of one implementation of a sample-rate converter.

Examples of sample-rate converters that are implemented according to teachings of the present invention are illustrated in FIG. 12. These converters are designed for use in a system that converts all of its input signals to intermediate signals having an intermediate sample rate and subsequently converts the intermediate signals to output signals having the same sample rate as the original input signals. In this example, the input signal sample rate is 44.1 kHz and the intermediate sample rate is 96 kHz. The internal operation of the converter and the timing of the destination signal is derived from one of the input signals using a phase-locked loop.

Referring to FIG. 12, the blocks with the label "AES In" represent components that receive a two-channel (stereo) audio signal that conforms to AES standard AES3-2003.

The Phase Locked Loop receives word-clock timing extracted by the "WClk In" block from one of the "AES In" blocks or, alternatively obtained from an external word-clock input, and generates a high-speed clock that is nominally at 45.1584 MHz. Preferably, the Phase Locked Loop uses an external voltage controlled crystal oscillator (VCXO) to provide a low-jitter clock with high accuracy.

A digital phase locked loop (Digital PLL) takes the clock generated by the Phase Locked Loop and computes an accurate estimate of the arrival time of each input signal sample, which also corresponds to the precise output time for each output signal sample. The arrival/output time estimate for a sample is referred to here as "Precise Event Time."

The "Coef ALU" block uses the Precise Event Time of each input/output sample to compute the filter coefficients required by the "Input SRC" and "Output SRC" blocks to perform sample-rate conversions.

The "Input SRC" block converts the sample rate of each input signal sample using the sample-rate conversion process illustrated in FIG. 11 where the destination signal sample interval $\tau_{out}$ is equal to 1/96000 seconds. This "Input SRC" block includes a ripple-correcting FIR filter as described above.

The "Output SRC" block converts the intermediate signals having a sample rate of 96 kHz into output signals having a sample rate of 44.1 kHz, which are passed to respective "AES OUT" blocks. The "Output SRC" block implements the sample-rate conversion process illustrated in FIG. 10 where the source signal sample interval $\tau_{in}$ is equal to 1/96000 seconds. This "Output SRC" block includes a ripple-correcting FIR filter as described above.

The "AES OUT" blocks receive signal samples from the "Output SRC" block and produce two-channel audio output signals that conform to AES standard AES3-2003. This block uses the low-jitter 45.1584 MHz clock generated by the Phase Locked Loop.

The "Coef ALU" block is provided with the Precise Event Time of each input signal sample and this Precise Event Time is broken into an integer part and a fractional part. For example, referring to FIG. 8, the Precise Event Time 175.376 is broken into the integer part (175.000) and the fractional part (0.376). The fractional part is represented as $\Delta f=0.376$. The "Coef ALU" block then computes the following to perform sample-rate conversion:

For the "Input SRC" block, the coefficients needed by the sample-rate conversion filter are five complex values that are computed as follows:

$$\text{InWeight}_i = 2R_i \tau_{in} P^{(1-\Delta f)}$$

so that the "Input SRC" block can sum each input sample into the filter state taking into account the weighting factors $2R_i \tau_{in}$ in addition to the time offset $1-\Delta f$. Note that this time offset is $1-\Delta f$ rather than $\Delta f$ because the factor $P^{\Delta f}$ needs to account for the time interval between the arrival time of the input sample and the end of the next output sample interval.

For the "Output SRC" block, the coefficients needed by the sample-rate conversion filter are five complex values that are computed as follows:

$$\text{OutWeight}_i = P^{\Delta f}$$

so that the "Output SRC" block can compute each output sample as a function of the current filter state by taking into account the time offset $\Delta f$:

G. Implementation

Figure 13:
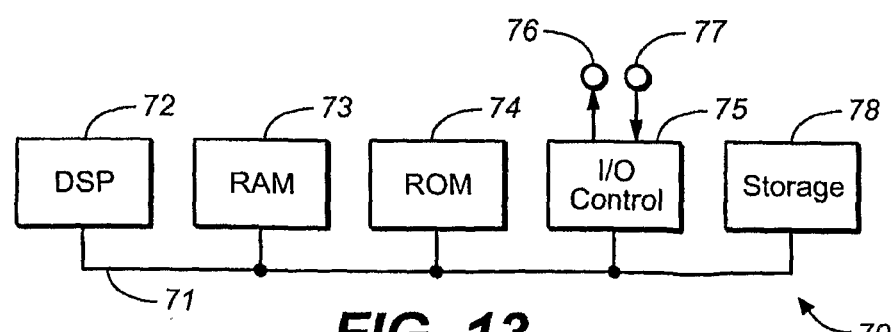
FIG. 13 is a schematic block diagram of a device that may be used to implement various aspects of the present invention.

Devices that incorporate various aspects of the present invention may be implemented in a variety of ways including software for execution by a computer or some other device that includes more specialized components such as digital signal processor (DSP) circuitry coupled to components similar to those found in a general-purpose computer. FIG. 13 is a schematic block diagram of a device 70 that may be used to implement aspects of the present invention. The DSP 72 provides computing resources. RAM 73 is system random access memory (RAM) used by the DSP 72 for processing. ROM 74 represents some form of persistent storage such as read only memory (ROM) for storing programs needed to operate the device 70 and possibly for carrying out various aspects of the present invention. I/O control 75 represents interface circuitry to receive and transmit signals by way of the communication channels 76, 77. In the embodiment shown, all major system components connect to the bus 71, which may represent more than one physical or logical bus; however, a bus architecture is not required to implement the present invention.

In embodiments implemented by a general purpose computer system, additional components may be included for interfacing to devices such as a keyboard or mouse and a display, and for controlling a storage device 78 having a storage medium such as magnetic tape or disk, or an optical medium. The storage medium may be used to record programs of instructions for operating systems, utilities and applications, and may include programs that implement various aspects of the present invention.

The functions required to practice various aspects of the present invention can be performed by components that are implemented in a wide variety of ways including discrete logic components, integrated circuits, one or more ASICs and/or program-controlled processors. The manner in which these components are implemented is not important to the present invention.

Software implementations of the present invention may be conveyed by a variety of machine readable media such as baseband or modulated communication paths throughout the spectrum including from supersonic to ultraviolet frequencies, or storage media that convey information using essentially any recording technology including magnetic tape, cards or disk, optical cards or disc, and detectable markings on media including paper.

The invention claimed is:

1. A method for sample rate conversion that comprises:
receiving source digital samples that represent a source electrical signal at a source sample rate;
generating destination digital samples by applying to the source digital samples a digital simulation of an analog filter that has an infinite impulse response, wherein the destination digital samples represent the source electrical signal at a destination sample rate that differs from the source sample rate, wherein the digital simulation simulates states of complex poles in the analog filter in a manner that reflects the states of the complex poles as being updated in response to values that are obtained from an interpolation of complex exponential functions and at rates that are variable, wherein values of the complex exponential functions are obtained by calculating products of values retrieved from lookup tables based on exponents of varying resolution; and
transmitting the destination digital samples.

2. The method according to claim 1, wherein the states of the complex poles are updated at rates that vary.

3. The method according to claim 1, wherein the states of the complex poles are updated in response to modifications of the source digital samples that account for the source digital samples being offset from times when the digital simulation updates the states of the complex poles.

4. The method according to claim 3, wherein the states of the complex poles are updated at a rate that does not vary.

5. The method according to claim 1, wherein the states of the complex poles are updated in response to modifications of the destination digital samples that account for the destination digital samples being offset from times when the digital simulation updates the states of the complex poles.

6. The method according to claim 5, wherein the states of the complex poles are updated at a rate that does not vary.

7. An apparatus for sample rate conversion that comprises:
an input terminal that receives source digital samples that represent a source electrical signal at a source sample rate;
circuitry coupled to the input terminal that provides a digital simulation of states of complex poles in an analog filter that has an infinite impulse response, wherein the circuitry generates destination digital samples that represent the source electrical signal at a destination sample rate that differs from the source sample rate by applying the digital simulation to the source digital samples as if the states of the complex poles are updated in response to values that are obtained from an interpolation of complex exponential functions and at rates that are variable, wherein the circuitry obtains values of the complex exponential functions by calculating products of values retrieved from lookup tables based on exponents of varying resolution; and
an output terminal coupled to the circuitry that transmits the destination digital samples.

8. The apparatus according to claim 7, wherein the circuitry updates the states of the complex poles at rates that vary.

9. The apparatus according to claim 7, wherein the circuitry updates the states of the complex poles in response to modifications of the source digital samples that account for the source digital samples being offset from times when the digital simulation updates the states of the complex poles.

10. The apparatus according to claim 9, wherein the circuitry updates the states of the complex poles at a rate that does not vary.

11. The apparatus according to claim 7, wherein the circuitry updates the states of the complex pales in response to modifications of the destination digital samples that account for the destination digital samples being offset from times when the digital simulation updates the states of the complex poles.

12. The apparatus according to claim 11, wherein the circuitry updates the states of the complex poles at a rate that does not vary.

13. A computer-readable storage medium recording a program of instructions that is executable by a device to perform a method for sample rate conversion, wherein the method comprises:
receiving source digital samples that represent a source electrical signal at a source sample rate;
generating destination digital samples by applying to the source digital samples a digital simulation of an analog filter that has an infinite impulse response, wherein the destination digital samples represent the source electrical signal at a destination sample rate that differs from the source sample rate, wherein the digital simulation simulates states of complex poles in the analog filter in a manner that reflects the states of the complex poles as being updated in response to values that are obtained from an interpolation of complex exponential functions and at rates that are variable, wherein values of the complex exponential functions are obtained by calculating products of values retrieved from lookup tables based on exponents of varying resolution; and
transmitting the destination digital samples.

14. The medium according to claim 13, wherein the states of the complex poles are updated at rates that vary.

15. The medium according to claim 13, wherein the states of the complex poles are updated in response to modifications of the source digital samples that account for the source digital samples being offset from times when the digital simulation updates the states of the complex poles.

16. The medium according to claim 15, wherein the states of the complex poles are updated at a rate that does not vary.

17. The medium according to claim 13, wherein the states of the complex poles are updated in response to modifications of the destination digital samples that account for the destination digital samples being offset front times when the digital simulation updates the states of the complex poles.

18. The medium according to claim 17, wherein the states of the complex poles are updated at a rate that does not vary.

* * * * *